US012769371B2

(12) United States Patent
Huang et al.

(10) Patent No.: US 12,769,371 B2
(45) Date of Patent: Oct. 20, 2026

(54) LIQUID-BLOCKING STRUCTURE

(71) Applicant: Acer Incorporated, New Taipei City (TW)

(72) Inventors: Yu-Chin Huang, New Taipei City (TW); Wen-Chieh Tai, New Taipei City (TW); Chih-Chun Liu, New Taipei City (TW); Cheng-Mao Chang, New Taipei City (TW)

(73) Assignee: ACER INCORPORATED, New Taipei City (TW)

( * ) Notice: Subject to any disclaimer, the term of this patent is extended or adjusted under 35 U.S.C. 154(b) by 108 days.

(21) Appl. No.: 18/983,808

(22) Filed: Dec. 17, 2024

(65) Prior Publication Data

US 2025/0216906 A1 Jul. 3, 2025

(30) Foreign Application Priority Data

Jan. 3, 2024 (TW) ................................ 113100296

(51) Int. Cl.
*G06F 1/16* (2006.01)
*H04R 1/02* (2006.01)
*H05K 5/02* (2006.01)

(52) U.S. Cl.
CPC .......... *G06F 1/1656* (2013.01); *G06F 1/1688* (2013.01); *H04R 1/023* (2013.01); *H05K 5/0214* (2022.08); *H04R 2499/15* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,398,436 B1 * | 6/2002 | Chao | G06F 3/0202 | 361/679.08 |
| 6,610,944 B2 * | 8/2003 | Lee | G06F 1/1662 | 400/490 |
| 6,628,507 B2 * | 9/2003 | Hsu | H01H 13/86 | 361/679.08 |

(Continued)

FOREIGN PATENT DOCUMENTS

| | | |
|---|---|---|
| CN | 211557487 U | 9/2020 |
| CN | 216057388 U | 3/2022 |

(Continued)

OTHER PUBLICATIONS

Taiwanese Office Action issued in Application No. 113100296, dated Sep. 18, 2024.

*Primary Examiner* — Lisa Lea-Edmonds
(74) *Attorney, Agent, or Firm* — Birch, Stewart, Kolasch & Birch, LLP

(57) ABSTRACT

A liquid-blocking structure for an electronic device is provided in this disclosure. A cover frame of the electronic device has an array of speaker holes. The liquid-blocking structure comprises a bracket body and a pad component. The bracket body is arranged corresponding to the array of speaker holes and includes a guide channel and a liquid collection tank. The pad component is disposed between the cover frame and the bracket body. The bracket body encompasses a range of the array of speaker holes. When liquid flows into the array of speaker holes, the guide channel receives the liquid and guides the liquid to the liquid collection tank.

18 Claims, 6 Drawing Sheets

(56) References Cited

U.S. PATENT DOCUMENTS

| | | | | |
|---|---|---|---|---|
| 6,716,518 | B2 * | 4/2004 | Chao | B32B 5/24 361/679.01 |
| 6,803,865 | B2 * | 10/2004 | DeLuga | H01H 13/702 345/169 |
| 7,619,880 | B2 * | 11/2009 | Liang | G06F 1/1616 361/679.08 |
| 7,838,784 | B2 * | 11/2010 | Arisaka | G06F 1/1662 200/306 |
| 7,990,693 | B2 * | 8/2011 | Nakajima | H01H 13/70 361/679.08 |
| 8,081,445 | B2 * | 12/2011 | Nakatani | G06F 1/1616 361/679.55 |
| 8,199,491 | B2 * | 6/2012 | Uchiyama | G06F 1/1656 361/679.55 |
| 8,578,667 | B2 * | 11/2013 | Yang | E04H 5/02 52/204.1 |
| 8,693,176 | B2 * | 4/2014 | Morino | G06F 1/1616 220/601 |
| 10,784,062 | B2 * | 9/2020 | Wang | G06F 1/1656 |
| 12,468,355 | B2 * | 11/2025 | Hosokai | G06F 1/1688 |
| 12,556,849 | B2 * | 2/2026 | Penrod | H04R 1/028 |
| 2003/0179540 | A1 * | 9/2003 | Suda | G06F 3/0202 361/679.08 |
| 2008/0304214 | A1 * | 12/2008 | Nakajima | G06F 1/1616 361/679.08 |
| 2017/0067244 | A1 * | 3/2017 | Sie | E03F 5/041 |
| 2018/0068808 | A1 * | 3/2018 | Wang | G06F 1/1656 |
| 2018/0310426 | A1 * | 10/2018 | Cho | G06F 1/1637 |
| 2024/0393842 | A1 * | 11/2024 | Hosokai | G06F 1/1688 |
| 2024/0393843 | A1 * | 11/2024 | Bandoh | G06F 1/1688 |
| 2025/0216906 | A1 * | 7/2025 | Huang | G06F 1/1616 |

FOREIGN PATENT DOCUMENTS

| | | | |
|---|---|---|---|
| CN | 217159928 | U | 8/2022 |
| JP | 2011-142502 | A | 7/2011 |

* cited by examiner

LIQUID-BLOCKING STRUCTURE

This application claims the benefits of the Taiwan application Serial No. 113100296 filed Jan. 3, 2024, the disclosure of which are incorporated by reference herein in their entirety.

TECHNICAL FIELD

The present invention relates to a liquid-blocking structure for an electronic device, and in particular relates to a liquid-blocking structure for an array of speaker holes of the electronic device.

BACKGROUND

Current electronic devices (such as laptop computers) have the following problems: the speaker sound holes may be easily penetrated by liquid (such as water), causing damage to the electronic parts/components inside the device. In view of the above, how to develop a liquid-blocking method for the speaker sound holes of laptop computers is the direction that those skilled in the art strive for.

SUMMARY

The present invention relates to a liquid-blocking structure for an electronic device, wherein the bracket body is provided with a guide channel and a liquid collection tank. The guide channel receives a liquid flowing into an array of speaker holes of the electronic device and guides the liquid to the liquid collection tank, thereby preventing the liquid from penetrating through the array of speaker holes into an interior of the electronic device. As such, internal electronic components of the electronic device can be protected from damage.

According to an aspect of the present invention, a liquid-blocking structure is provided. A cover frame of the electronic device has an array of speaker holes. The liquid-blocking structure comprises a bracket body and a pad component. The bracket body is arranged corresponding to the array of speaker holes and includes a guide channel and a liquid collection tank. The pad component is disposed between the cover frame and the bracket body. The bracket body encompasses a range of the array of speaker holes. When liquid flows into the array of speaker holes, the guide channel receives the liquid and guides the liquid to the liquid collection tank.

The above summary is not intended to represent all embodiments or all aspects of the present invention. Rather, the foregoing summary merely provides examples that illustrate the novel aspects and features of the present invention. The above and other aspects of the present invention will become better understood with regard to the following detailed description of the preferred but non-limiting embodiment(s). The following description is made with reference to the accompanying drawings.

BRIEF DESCRIPTION OF THE DRAWINGS

The following FIGS. are merely illustrative of embodiments and are not intended to limit the scope of embodiments or claims.

FIG. 1 is a partial schematic diagram of a cover frame of an electronic device that a liquid-blocking structure, according to an embodiment of the present invention, is applied to.

DETAILED DESCRIPTION

Detailed descriptions of each embodiment of the present invention are disclosed below with reference to accompanying drawings. Apart from the said detailed descriptions, any embodiments in which the present invention can be used as well as any substitutions, modifications or equivalent changes of the said embodiments are within the scope of the present invention, and the descriptions and definitions in the claims shall prevail. Specific details and embodiments are disclosed in the specification for anyone ordinary skilled in the art to comprehensively understand the present invention, not for limiting the present invention. Moreover, generally known procedures or elements are not disclosed to avoid adding unnecessary restrictions to the present invention. Unless otherwise specified, element designations common to different drawings can be regarded as corresponding elements. These drawings are for describing the connection relationship between the elements of the embodiments, and the dimension scales used in the accompanying drawings are not based on actual proportion of the elements.

Figure 1:
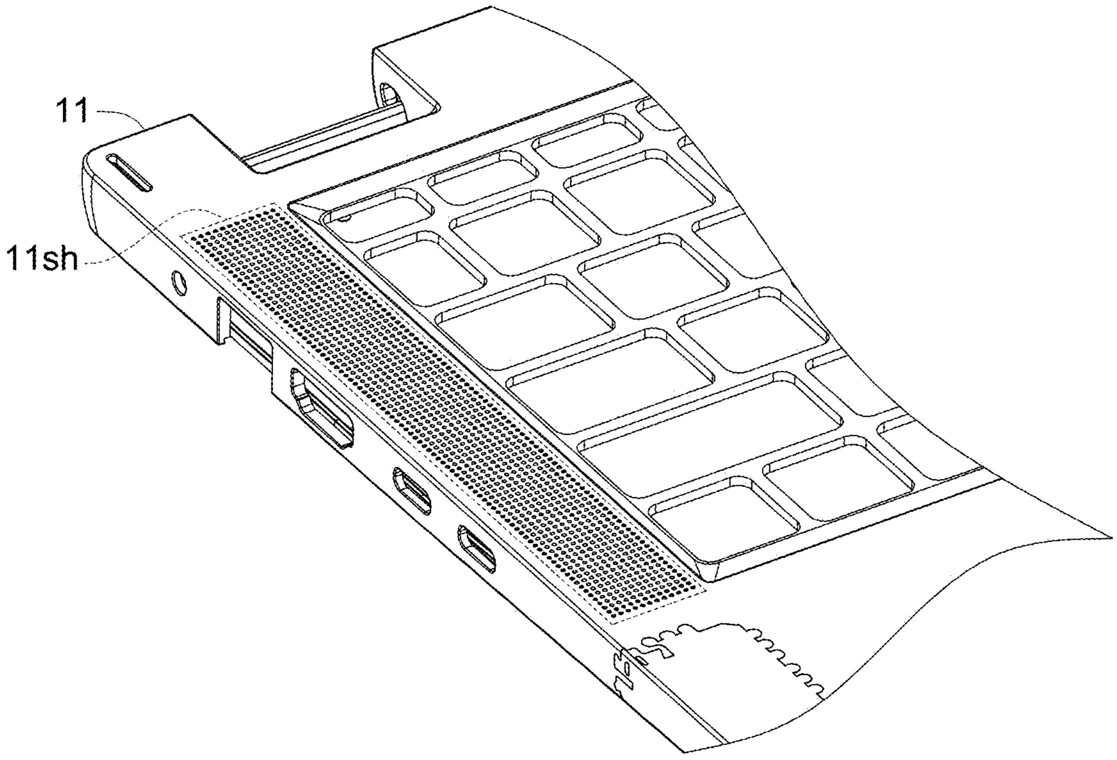

Please refer to FIG. 1, FIG. 1 shows a partial schematic diagram of a cover frame 11 of an electronic device that the liquid-blocking structure, according to an embodiment of the present invention, is applied to.

The electronic device herein set forth is, for example, a laptop computer, and the cover frame 11 of which may be a keyboard frame correspondingly. That is, the cover frame 11 is commonly known as the "C cover" in the field of laptop computers. As shown in FIG. 1, one side of the cover frame 11 may have an array of speaker holes 11*sh*. FIG. 1 is merely a partial illustration, it should be understood that the other opposite side of the cover frame 11 may also have an array of speaker holes 11*sh* to form a symmetrical sound output arrangement. As mentioned above, the electronic device is, for example, a laptop computer, and the array of speaker holes 11*sh* is so-called speaker sound holes. In view of the prior art, the speaker sound holes of the laptop computer may be easily penetrated by liquid (such as water), causing damage to the electronic parts/components inside the device, a liquid-blocking structure that can improve this problem is described below.

Figure 2A:
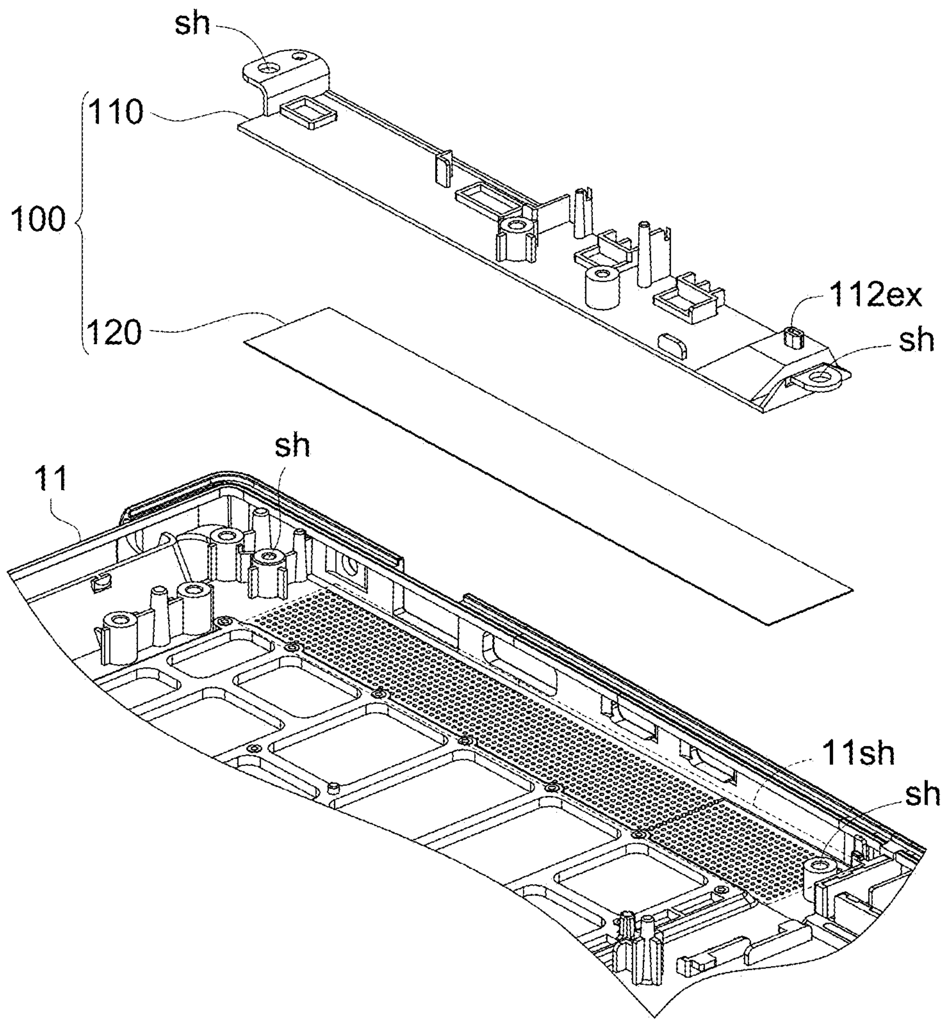
FIG. 2A is an explosion diagram of a liquid-blocking structure according to an embodiment of the present invention and a cover frame of an electronic device.
Figure 2B:
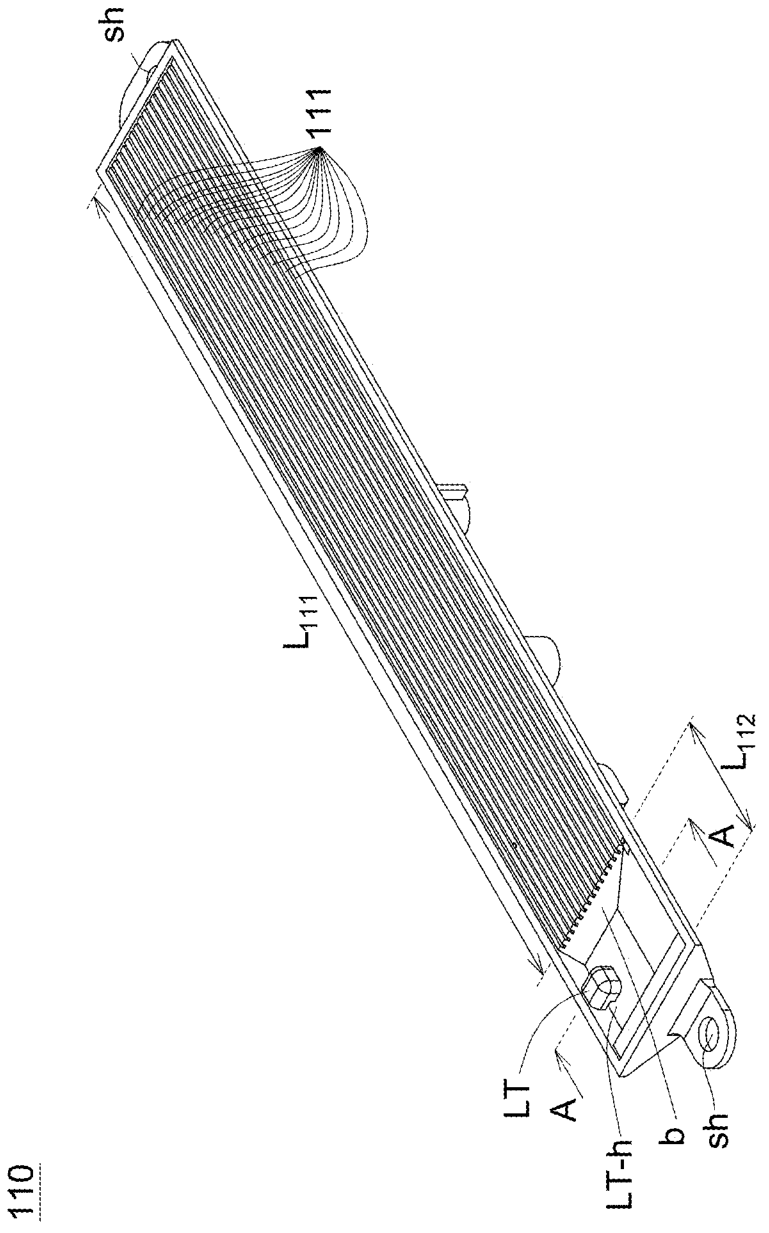
FIG. 2B is a schematic diagram of a bracket body of the liquid-blocking structure in FIG. 2A.

Please refer to FIG. 2A to FIG. 2B, FIG. 2A shows an explosion diagram of the liquid-blocking structure 100 and the cover frame 11 according to an embodiment, and FIG. 2B shows a bracket body 110 of the liquid-blocking structure 100.

The liquid-blocking structure 100 is suitable for electronic devices to prevent liquid flowing in from the array of speaker holes 11*sh* from penetrating into an interior of the electronic device and causing damage. As shown in FIG. 2A, the liquid-blocking structure 100 may include a bracket body 110 and a pad component 120. The bracket body 110 is arranged corresponding to the array of speaker holes 11*sh*.

FIG. 2A shows a view from the back of the cover frame 11 in FIG. 1, namely the liquid-blocking structure 100 is disposed below the array of speaker holes 11*sh*, and the bracket body 110, the pad component 120 and the cover frame 11 of the electronic device are stacked vertically. The bracket body 110 can encompass the range of the array of speaker holes 11*sh* to ensure that liquid which may flow in from any local position of the array of speaker holes 11*sh* can be blocked. The pad component 120 is disposed between the cover frame 11 and the bracket body 110. The pad component 120 is, for example, non-woven fabric, which may be made of Mylar. The pad component 120 is laid under the array of speaker holes 11*sh* to mask the liquid-blocking structure 100, making the liquid-blocking structure 100 invisible in the appearance of the electronic device and providing an aesthetic effect.

As shown in FIG. 2B, the bracket body 110 may include a guide channel 111 and a liquid collection tank 112. The guide channel 111 and the liquid collection tank 112 both correspond to the bottom of the array of speaker holes 11*sh*. When liquid flows in from the array of speaker holes 11*sh*, the guide channel 111 receives the liquid and guides the liquid to flow into the liquid collection tank 112. The guide channel 111 may be designed to be slightly inclined to a horizontal plane, so as to accelerate the flow of liquid to the liquid collection tank 112. The liquid collection tank 112 may be provided with a drainage tube LT. When the liquid accumulates in the liquid collection tank 112 to a critical height, the drainage tube LT can drain a part of the liquid out of the liquid collection tank 112 from an outlet 112*ex* through its opening LT-h. That is, the drainage tube LT may be openly connected to an outside of the electronic device.

As shown in FIG. 2B, in the extension direction of the bracket body 110, a length $L_{111}$ of the guide channel 111 is greater than a length $L_{112}$ of the liquid collection tank 112. The liquid collection tank 112 may have an inclined surface b, and the inclined surface b is located at the connection between the liquid collection tank 112 and the guide channel 111. When the liquid is guided to the liquid collection tank 112 through the guide channel 111, the inclined surface b can help the liquid flow into the liquid collection tank 112 and prevent the liquid from flowing back to the guide channel 111. In the embodiment shown in FIG. 2A and FIG. 2B, the bracket body 110 of the liquid-blocking structure 100 and the cover frame 11 of the electronic device have corresponding fixing holes sh, so that the bracket body 110 can be fixed to the cover by locking. Specifically, the bracket body 110 and the cover frame 11 can be fixed, for example, by locking a screw to the fixing holes sh of the bracket body 110 and the cover frame 11 together. Corresponding to the fixation of the bracket body 110 and the cover frame 11, the pad component 120 is clamped between the bracket body 110 and the cover frame 11.

In the embodiment shown in FIG. 2A and FIG. 2B, since the bracket body 110 and the cover frame 11 have been locked and fixed on both sides, the middle portion of the bracket body 110 does not need to be locked and fixed to a base (not shown) of the electronic device. Said base of the electronic device is a component assembled with the cover frame 11. That is, the base is commonly known as the "D cover" in the field of laptop computers. If the middle portion of the bracket body 110 is further locked and fixed to the base of the electronic device, the middle portion of the bracket body 110 will be pulled up and down by the cover frame 11 and the base. This may easily cause liquid to leak from the guide channel 111 or even cause the bracket body 110 to deformation, thereby affecting the liquid-blocking performance.

Figure 3A:
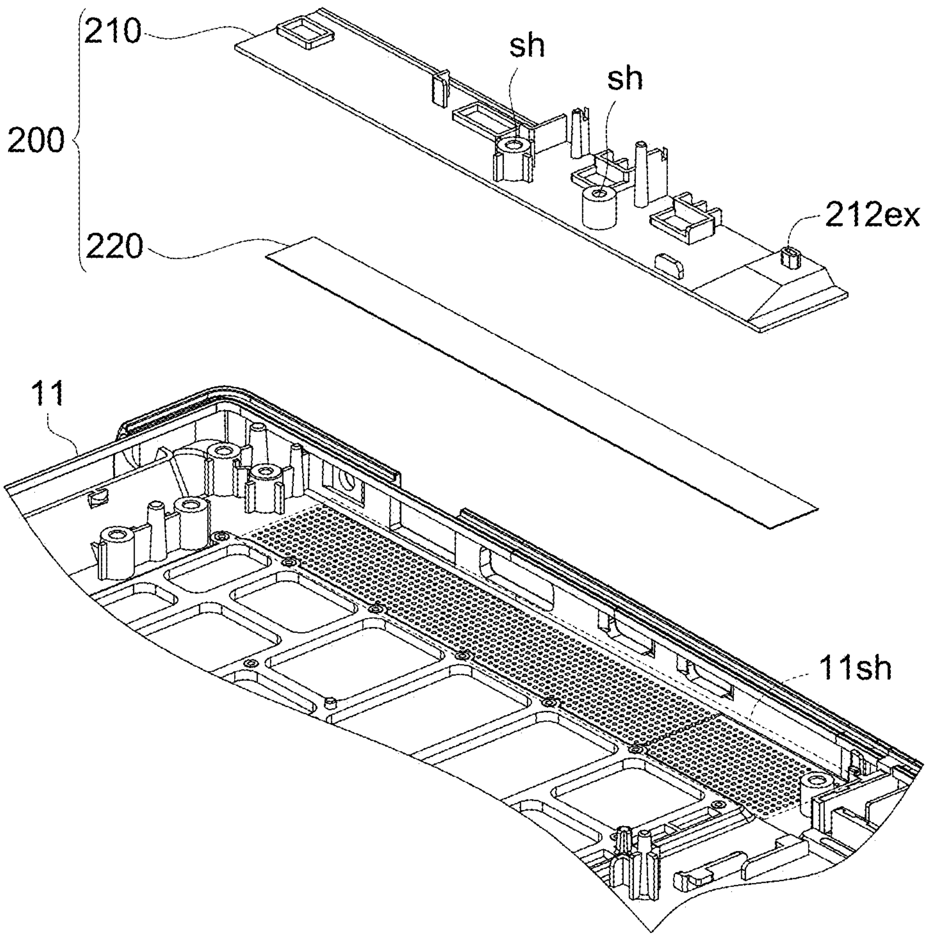
FIG. 3A is an explosion diagram of a liquid-blocking structure according to another embodiment of the present invention and a cover frame of an electronic device.
Figure 3B:
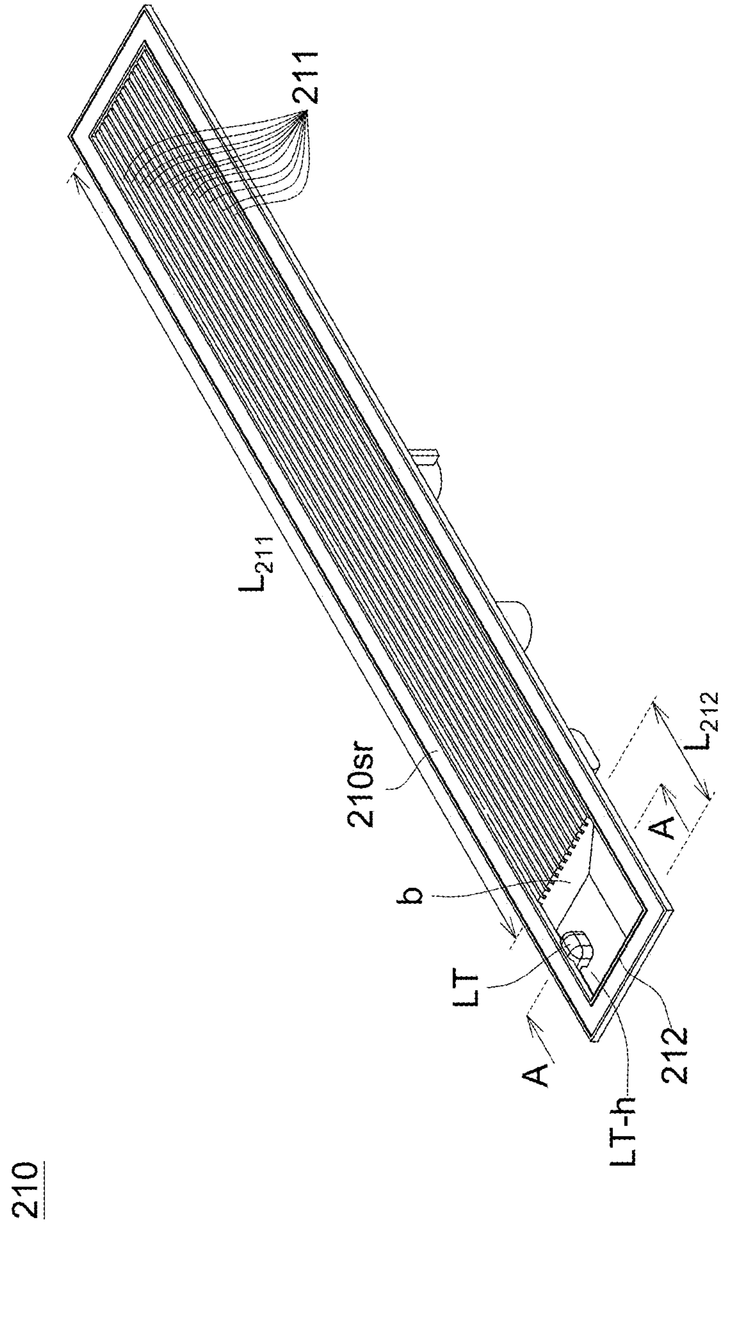
FIG. 3B is a schematic diagram of a bracket body of the liquid-blocking structure in FIG. 3A.

Please refer to FIG. 3A and FIG. 3B. FIG. 3A shows an explosion diagram of the liquid-blocking structure 200 and the cover frame 11 according to another embodiment, and FIG. 3B shows a schematic diagram of the bracket body 210 of the liquid-blocking structure 200 in FIG. 3A.

The liquid-blocking structure 200 is suitable for electronic devices to prevent liquid flowing in from the array of speaker holes 11*sh* from penetrating into an interior of the electronic device and causing damage. As shown in FIG. 3A, the liquid-blocking structure 200 may include a bracket body 210 and a pad component 220. The bracket body 210 is arranged corresponding to the array of speaker holes 11*sh*. FIG. 3A shows a view from the back of the cover frame 11 in FIG. 1. That is, the liquid-blocking structure 200 is disposed below the array of speaker holes 11*sh*, and the bracket body 210, the pad component 220 and the cover frame 11 of the electronic device are stacked vertically. The bracket body 210 can encompass the range of the array of speaker holes 11*sh* to ensure that liquid which may flow in from any local position of the array of speaker holes 11*sh* can be blocked. The pad component 220 is disposed between the cover frame 11 and the bracket body 210. The pad component 220 is, for example, non-woven fabric, which may be made of Mylar. The pad component 220 is laid under the array of speaker holes 11*sh* to mask the liquid-blocking structure 200, making the liquid-blocking structure 200 invisible in the appearance of the electronic device and providing an aesthetic effect.

As shown in FIG. 3B, the bracket body 210 may include a guide channel 211 and a liquid collection tank 212. The guide channel 211 and the liquid collection tank 212 both correspond to the bottom of the array of speaker holes 11*sh*. When liquid flows in from the array of speaker holes 11*sh*, the guide channel 211 receives the liquid and guides the liquid to flow into the liquid collection tank 212. The guide channel 211 may be designed to be slightly inclined to a horizontal plane, so as to accelerate the flow of liquid to the liquid collection tank 212. The liquid collection tank 212 may be provided with a drainage tube LT. When the liquid accumulates in the liquid collection tank 112 to a critical height, the drainage tube LT can drain a part of the liquid out of the liquid collection tank 212 from an outlet 212*ex* through its opening LT-h. That is, the drainage tube LT may be openly connected to an outside of the electronic device.

As shown in FIG. 3B, in the extension direction of the bracket body 210, a length $L_{211}$ of the guide channel 211 is greater than a length $L_{212}$ of the liquid collection tank 212. The liquid collection tank 212 may have an inclined surface b, and the inclined surface b is located at the connection between the liquid collection tank 212 and the guide channel 211. When the liquid is guided to the liquid collection tank 212 through the guide channel 211, the inclined surface b can help the liquid flow into the liquid collection tank 212 and prevent the liquid from flowing back to the guide channel 211. In the embodiment shown in FIG. 3A and FIG. 3B, the bracket body 210 may have an annular area 210*sr*, and the guide channel 211 and the pad component 220 may be located within a range surrounded by the annular area 210*sr*. In the embodiment shown in FIG. 3A and FIG. 3B, the bracket body 210 of the liquid-blocking structure 200 can be fixed to the cover frame 11 by disposing an adhesive in the annular region 210*sr*. Specifically, the liquid-blocking structure 200 can be coated or attached with a frame glue on the annular area 210*sr* to be fixed to the cover frame 11, and the pad component 220 can be clamped between the bracket body 210 and the cover frame 11. Due to the inward arrangement of the annular area 210*sr*, it can be understood that the size of the pad component 220 is less than the pad component 120 of the previous embodiment.

In the embodiment shown in FIG. 3A and FIG. 3B, since the bracket body 210 is adhesively fixed to the cover frame 11 through the adhesive in the annular area 210*sr*, the middle portion of the bracket body 210 can be fixed to the base (not shown, commonly known as the "D cover" in the field of laptop computers) of the electronic device. Thus, it is not going to happen that the middle portion of the bracket body 210 is pulled up and down by the cover frame 11 and base and then liquid leaks from the guide channel 211 or even the bracket body 210 is deformed.

Figure 4:
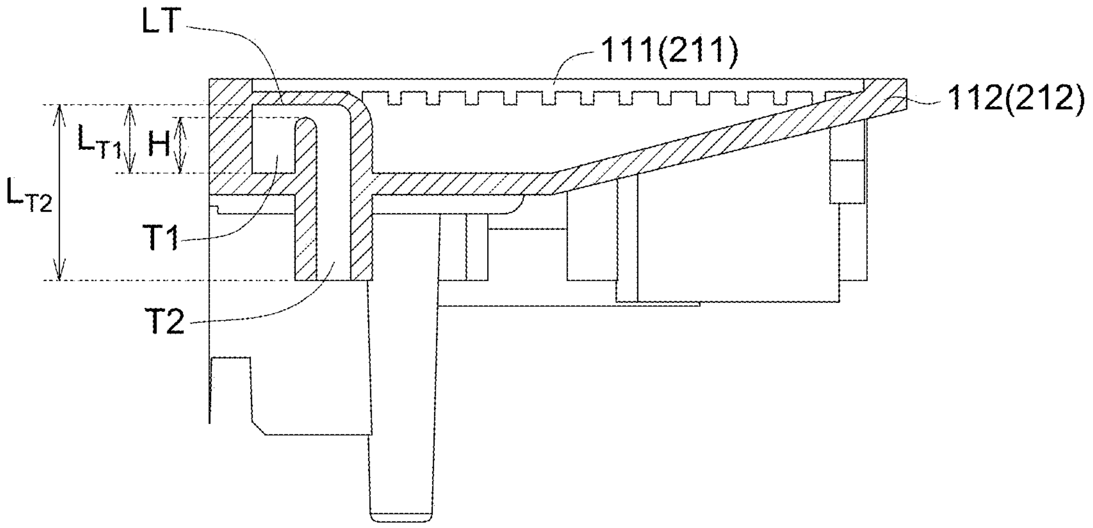
FIG. 4 is a partial cross-section view of the bracket bodies in FIG. 2B and FIG. 3B.

Please refer to FIG. 4, FIG. 4 shows a cross-sectional view of the drainage tube LT included in the bracket bodies 110 and 210 in FIG. 2B and FIG. 3B.

As shown in FIG. 4, the drain pipe LT includes a first tube portion T1 and a second tube portion T2. In the cross-section view, the first tube portion T1 and the second tube portion T2 present an inverted U-shaped structure, and the extension length $L_{T1}$ of the first tube portion T1 is less than the extension length $L_{T2}$ of the second tube portion T2. When the liquid flows into the liquid collection tank 112 (or the liquid collection tank 212), because the opening LT-h of the drainage tube LT fluidly connects the first tube portion T1 and the liquid collection tank 112 (or the liquid collection tank 212), a part of the liquid can flow into the first tube portion T1 through the opening LT-h and can be accommodated in the first tube portion T1 at a liquid level. At this time, based on the principle of Communicating Vessels, the liquid level of the liquid in the first tube portion T1 will be the same as that in the liquid collection tank 112 (or liquid collection tank 212). As the liquid accumulated in the liquid collection tank 112 (or the liquid collection tank 212) gradually increases, the liquid level in the first tube portion T1 also gradually increases. When the liquid level in the first tube portion T1 is higher than the critical height H, this part of the liquid will enter the second tube portion T2, then flow through the second tube portion T2 and be discharged out of the liquid collection tank 112 (or the liquid collection tank 212) from the outlet 112*ex* (or the outlet 212*ex*).

Based on the above, the present invention relates to a liquid-blocking structure for an electronic device, wherein the bracket body is provided with a guide channel and a liquid collection tank. The guide channel receives a liquid flowing into an array of speaker holes of the electronic device and guides the liquid to the liquid collection tank, thereby preventing the liquid from penetrating through the array of speaker holes into an interior of the electronic device. Further, the collected liquid can be discharged from the liquid collection tank through the arrangement of the drainage tube of the liquid collection tank. As such, internal electronic components of the electronic device can be protected from damage.

It will be apparent to those skilled in the art that various modifications and variations may be made to the disclosed embodiments. It is intended that the specification and examples be considered as exemplars only, with a true scope of the disclosure being indicated by the following claims and their equivalents.

What is claimed is:

1. A liquid-blocking structure for an electronic device, wherein a cover frame of the electronic device has an array of speaker holes, and the liquid-blocking structure comprises:

a bracket body, arranged corresponding to the array of speaker holes and including a guide channel and a liquid collection tank; and a pad component, disposed between the cover frame and the bracket body;

wherein the bracket body encompasses a range of the array of speaker holes, and when liquid flows into the array of speaker holes, the guide channel receives the liquid and guides the liquid to the liquid collection tank.

2. The liquid-blocking structure of claim 1, wherein in an extension direction of the bracket body, a length of the guide channel is greater than a length of the liquid collection tank.

3. The liquid-blocking structure of claim 1, wherein the liquid collection tank includes a drainage tube, and when the liquid accumulates in the liquid collection tank to a critical height, the drainage tube drains a part of the liquid out of the liquid collection tank.

4. The liquid-blocking structure of claim 3, wherein the drainage tube has an opening, and the drainage tube drains a part of the liquid out of the liquid collection tank via the opening.

5. The liquid-blocking structure of claim 3, wherein the drainage tube includes a first tube portion and a second tube portion being connected to each other, when the liquid flows into the liquid collection tank, a part of the liquid is accommodated in the first tube portion at a liquid level, and when the liquid level is higher than the critical height, the part of the liquid flows through the second tube portion and is discharged from the liquid collection tank.

6. The liquid-blocking structure of claim 5, wherein an extension length of the first tube portion is less than an extension length of the second tube portion.

7. The liquid-blocking structure of claim 5, wherein in a cross-section view, the first tube portion and the second tube portion present an inverted U-shaped structure.

8. The liquid-blocking structure of claim 1, wherein the liquid collection tank has an inclined surface located at the connection between the liquid collection tank and the guide channel.

9. The liquid-blocking structure of claim 1, wherein the bracket body has an annular area, so that the bracket body can be fixed to the cover frame by disposing an adhesive in the annular area.

10. The liquid-blocking structure of claim 9, wherein the drainage tube is located within a range surrounded by the annular area.

11. The liquid-blocking structure of claim 9, wherein the pad component is located within a range surrounded by the annular area.

12. The liquid-blocking structure of claim 1, wherein the bracket body and the cover frame have corresponding fixing holes, so that the bracket body can be fixed to the cover frame by locking.

13. The liquid-blocking structure of claim 12, wherein the pad component is clamped between the bracket body and the cover frame.

14. The liquid-blocking structure of claim 1, wherein the pad component is a non-woven fabric.

15. The liquid-blocking structure of claim 14, wherein the non-woven fabric is made of Mylar.

16. The liquid-blocking structure of claim 1, wherein the drainage tube is inclined to a horizontal plane.

17. The liquid-blocking structure of claim 1, wherein the electronic device is a laptop computer.

18. The liquid-blocking structure of claim 17, wherein the cover frame is a keyboard frame.

* * * * *